(12) United States Patent
Raychowdhury et al.

(10) Patent No.: US 9,722,606 B2
(45) Date of Patent: Aug. 1, 2017

(54) DIGITAL CLAMP FOR STATE RETENTION

(71) Applicant: INTEL CORPORATION, Santa Clara, CA (US)

(72) Inventors: Arijit Raychowdhury, Hillsboro, OR (US); Charles Augustine, West Lafayette, IN (US); James W. Tschanz, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/331,280

(22) Filed: Oct. 21, 2016

(65) Prior Publication Data

US 2017/0041001 A1 Feb. 9, 2017

Related U.S. Application Data

(62) Division of application No. 13/718,372, filed on Dec. 18, 2012, now Pat. No. 9,484,917.

(51) Int. Cl.
*G05F 1/10* (2006.01)
*G05F 1/59* (2006.01)
(Continued)

(52) U.S. Cl.
CPC .......... *H03K 19/0016* (2013.01); *G05F 1/10* (2013.01); *G05F 1/461* (2013.01); *G05F 1/59* (2013.01);
(Continued)

(58) Field of Classification Search
CPC .......... H03K 19/0008; H03K 19/0013; H03K 19/0016; G05F 1/10; G05F 1/46;
(Continued)

(56) References Cited

U.S. PATENT DOCUMENTS 7,206,249 B2  4/2007  Khellah et al.
7,504,854 B1  3/2009  Look et al.
(Continued)

OTHER PUBLICATIONS

Notification of Transmittal of the International Search Report and the Written Opinion of the International Searching Authority issued for International Patent Application No. PCT/US2012/071714, 11 pp. mailed Sep. 12, 2013.
(Continued)

*Primary Examiner* — Patrick O'Neill
(74) *Attorney, Agent, or Firm* — Blakely, Sokoloff, Taylor & Zafman LLP (57) ABSTRACT

Described is an apparatus which comprises: a clamp coupled between a first power supply and a second power supply, the clamp including a plurality of transistors, a circuit to operate with the second power supply; and a control unit to turn on and off the plurality of transistors to adjust the second power supply when the apparatus enters a low power mode. The control unit includes a first comparator to compare the second power supply with a first reference, a second comparator to compare the second power supply with a second reference, and a counter. The counter counts up when the second power supply is higher than the first reference and counts down when the second power supply is lower than the second reference.

12 Claims, 10 Drawing Sheets

(51) Int. Cl.
*H03K 19/00* (2006.01)
*G05F 1/46* (2006.01)
*G06F 1/32* (2006.01)
*H03K 3/037* (2006.01)

(52) U.S. Cl.
CPC .......... *G06F 1/3287* (2013.01); *G06F 1/3296* (2013.01); *H03K 3/0377* (2013.01); *H03K 19/0008* (2013.01)

(58) Field of Classification Search
CPC . G05F 1/461; G05F 1/465; G05F 1/56; G05F 1/565; G05F 1/59
See application file for complete search history.

(56) References Cited

U.S. PATENT DOCUMENTS

| | | | |
|---|---|---|---|
| 7,696,649 B2 | 4/2010 | Frey et al. |
| 7,737,720 B2 | 6/2010 | Idgunji et al. |
| 7,812,631 B2 | 10/2010 | Kim et al. |
| 8,368,376 B2 | 2/2013 | Cheng et al. |
| 8,384,424 B2 | 2/2013 | Cho |
| 8,395,440 B2 | 3/2013 | Sandhu et al. |
| 8,476,966 B2 | 7/2013 | Buechner et al. |
| 8,604,826 B2 | 12/2013 | Cho et al. |
| 8,760,217 B2 | 6/2014 | Chua-Eoan et al. |
| 8,823,445 B2 | 9/2014 | Choy et al. |
| 9,484,917 B2 * | 11/2016 | Raychowdhury .. H03K 19/0008 |
| 2005/0232010 A1 | 10/2005 | Cernea |
| 2009/0116307 A1 | 5/2009 | Cottier et al. |
| 2010/0329044 A1 | 12/2010 | Yeung |
| 2011/0075491 A1 | 3/2011 | Yun et al. |
| 2013/0100730 A1 | 4/2013 | Chang et al. |

OTHER PUBLICATIONS

Garcia, Jose C., et al., "High Performance Bootstrapped CMOS Low to High-Swing Level-Converter for On-Ship Interconnects," 18th European Conference on Circuit Theory and Design, pp. 795-798, 2007.

Shrivastava, Aatmesh, et al., "A Charge Pump Based Receiver Circuit for Voltage Scaled Interconnect," International Symposium on Low Power Electronics and Design, pp. 327-332, 2012.

Zhang, Hui, et al., "Low-Swing On-Chip Signaling Techniques: Effectiveness and Robustness," IEEE Transactions on Very Large Scale Integration (VLSI) Systems, vol. 8, No. 3, pp. 264-272, Jun. 2000.

* cited by examiner

DIGITAL CLAMP FOR STATE RETENTION

CLAIM OF PRIORITY

The present application is a divisional application of U.S. patent application Ser. No. 13/718,372, titled "Digital Clamp for State Retention," filed on Dec. 18, 2012, and which is incorporated by reference here in its entirety.

BACKGROUND

As process technologies scale (or shrink), transistor leakage increases for the same power supply level. Increase in leakage increases power consumption. As market converges to lower power consumption devices, there is a need to reduce power consumption including reducing leakage power of a device.

In current practice, when a logic block goes to sleep (e.g., sleep mode) and all relevant architectural states need to be preserved, it is customary to scan the architectural states out and store them in the cache or another memory. Doing so requires energy and time for reading the architectural states and then writing them back, once the logic block goes back to an active state. This procedure impacts boot-up time and depending on the number of architectural states to be preserved, the wakeup time can be a few hundred to a few thousand cycles. So, if the logic block has to be used after a few tens or hundreds of cycles, it cannot go to a sleep state and have to be kept 'ON.' Such strategy increases the overall leakage power during standby.

In another implementation, all the relevant sequentials (latches or flip-flops) are retrofitted with a shadow latch (also called balloon latch), which has higher threshold (Vt) transistor cells than Vt of other transistor cells. Before the logic unit goes to standby (e.g., sleep mode), the data from the sequentials is copied to the shadow latch. The global supply grid (e.g., Vcc grid) of the logic is collapsed while a separate supply line (e.g., Vcc line) routed to the shadow latches is kept alive for state retention. This helps with quick boot-up. However, doing so requires the use and technology support for high Vt cells. Further, a significant number of sequentials need to have shadow cells. In case of external IPs (where we may not have observability into the IP) all the sequentials need to have shadow latches. The term "External IP" generally refers to a hardware block which has been licensed from a third party vendor. Designs for such hardware blocks cannot be modified to build any shadow latch. The area occupied by the shadow latches along with the area to route (and distribute) a separate supply line (e.g., Vcc line) into the logic block, results in a significant overhead.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments describe a digital clamp that is activated when a logic block goes to sleep state. In one embodiment, a reference voltage (which is substantially equal to state retention voltage of logic units with embedded state-retention sequentials) is compared with a virtual power supply (Vvcc) to adjust Vvcc to a retention voltage level.

The term "retention voltage level" generally refers to a voltage supply level below which the circuit receiving the power supply does not operate properly. For example, retention voltage supply level for a sequential unit (e.g., flip-flop, latch) is a power supply level below which the data stored in the sequential unit is lost or is corrupted.

In one embodiment, clamping of the main power supply (Vcc) is performed in a few cycles (depending on the resolution) when the processor enters sleep mode. In one embodiment, control unit of the digital clamp allows Vvcc to rise above retention level and substantially close to Vcc level when the processor enters wake-up mode. In one embodiment, the control logic adjusts Vvcc level above retention level in a single clock cycle. The embodiments result in little area overhead, and being a digital solution, are highly scalable.

In one embodiment, the digital clamp is operable to adjust the level of Vvcc to be at the minimum operating voltage level Vmin. The term "minimum operating voltage" (Vmin) generally refers to power supply level below which circuits do not function properly. Generally, Vmin is equal to or slightly higher than retention voltage supply level. For example, retention voltage supply level for a sequential unit may be 550 mV and Vmin may be 550 mV or higher (e.g., 650 mV) to include guard band.

In one embodiment, an integrated circuit (e.g., a processor) reduces leakage power via an apparatus that comprises a clamp coupled between a first power supply (e.g., Vcc) and a second power supply (e.g., Vvcc); and a circuit to operate with the second power supply, wherein the clamp is operable to adjust the second power supply when the apparatus enters a low power mode (e.g., sleep mode, idle mode). In one embodiment, the apparatus further comprises: a comparator to compare the second power supply with a reference; a counter to count up or down according to an output of the comparator, and a decoder to convert an output of the counter to a digital control signal for adjusting the second power supply via the clamp. In one embodiment, the comparator is a clocked comparator.

In one embodiment, the clamp comprises p-type devices coupled to the first and second power supplies, where the digital control signal of the decoder is provided to the clamp for controlling the clamp. In one embodiment, the decoder generates a thermometer coded digital control signal or a binary weighted digital control signal. In one embodiment, the circuit comprises combinational logic units and sequential units.

In one embodiment, the apparatus comprises a first oscillator to generate a signal of first frequency; a second oscillator to generate a signal of second frequency; and a multiplexer to selectively select one of the signals of first and second frequencies. In one embodiment, the first oscillator receives a reference voltage, and where the second oscillator is coupled to the second power supply. In one embodiment, the reference voltage is externally generated and supplied to the apparatus. For example, an off chip reference generator may provide the reference voltage as an input to the apparatus for the first oscillator. In one embodiment, the reference voltage is internally generated. For example, an on-die band-gap reference circuit or any other reference circuit may be used to generate the reference voltage locally and supplied to the first oscillator.

In one embodiment, the apparatus further comprises a first counter to count up or down in response to an output of the multiplexer. In one embodiment, the apparatus further comprises a second counter to count up or down according to an output of the first counter. In one embodiment, the apparatus comprises a decoder to generate a digital signal according to an output of the second counter, the digital signal to adjust the second power supply via the clamp.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" refers to converting a design (schematic and layout) from one process technology to another process technology. The term "scaling" generally also refers to downsizing layout and devices within the same technology node. The terms "substantially," "close," "approximately," "near," "about," herein refer to being within +/−20% of a target value.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. Source and drain terminals may be identical terminals and are interchangeably used. Transistors may also include Tri-gate and FinFet transistors. Those skilled in the art will appreciate that other transistors, for example, Bi-polar junction transistors-BJT PNP/NPN, BiCMOS, CMOS, eFET, etc., may be used without departing from the scope of the disclosure. The term "MN" indicates a n-type transistor (e.g., NMOS, NPN BJT, etc.) and the term "MP" indicates a p-type transistor (e.g., PMOS, PNP BJT, etc.).

Figure 1:
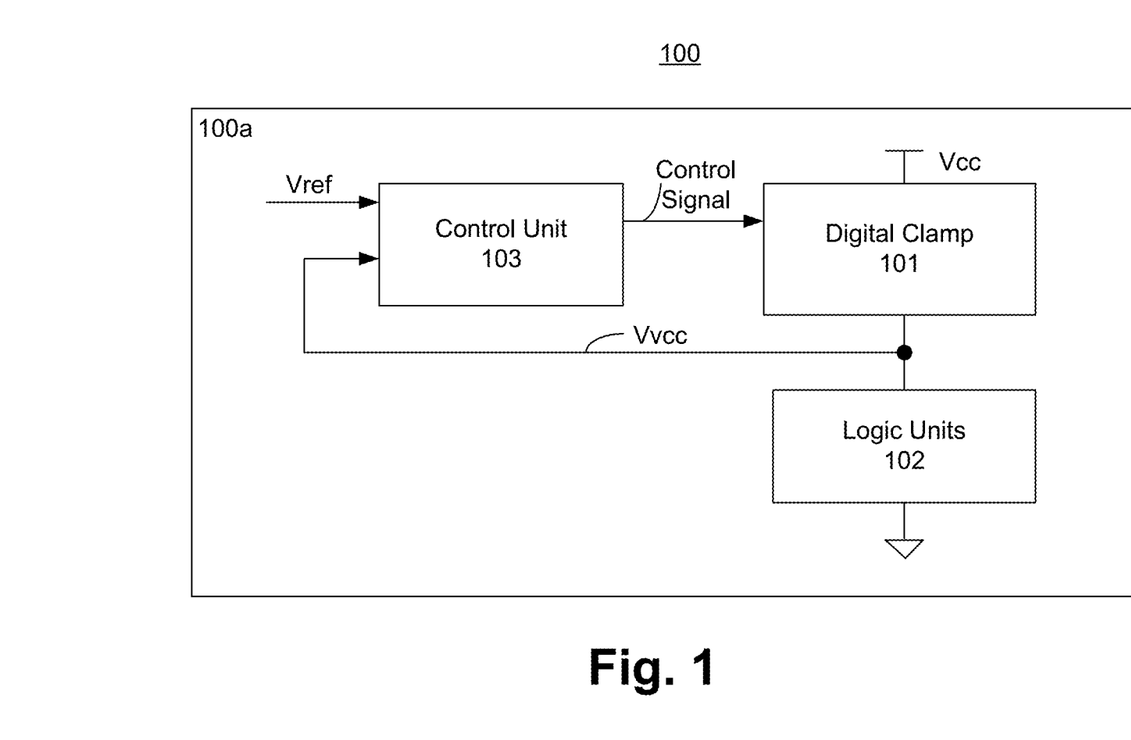
FIG. 1 is a high level block diagram of an integrated circuit or part of the integrated circuit having an apparatus to reduce leakage power and retain states of logic units, according to one embodiment of the disclosure.

FIG. 1 is a high level block diagram 100 of an integrated circuit 100a or part of the integrated circuit having an apparatus to reduce leakage power and retain states of logic units, according to one embodiment of the disclosure. In one embodiment, integrated circuit 100a comprises a digital clamp 101, logic units 102, and a control unit 103.

In one embodiment, digital clamp 101 receives input power supply Vcc and generates a virtual power supply (Vvcc) which is provided as power supply to logic units 102. In one embodiment, logic units 102 comprise any one or more of sequential logic units (e.g., flip-flops, latches), memories (e.g., SRAM, DRAM), and combinational logic units. In one embodiment, digital clamp 101 receives control signals from control unit 103 that determines a number of transistors that are turned on or off in the digital clamp 101 to adjust the level of Vvcc.

In one embodiment, control unit 103 receives a reference voltage (Vref) indicative of what Vvcc needs to be when the integrated circuit 100a enters a low power mode e.g., sleep mode. The term "power mode" (e.g., sleep mode, idle mode, wake-up mode, normal mode, active mode) generally refers to power states of a processor as defined by the Advanced Configuration and Power Interface (ACPI) specification (for example, Revision 5.0, published on Nov. 23, 2011) which provides an open standard for device configuration and power management by an operating system. However, the embodiments are not limited to the ACPI low power states. Other specifications that offer lower power states for a processor may be used with the embodiments of the squelch detector.

In one embodiment, control unit 103 monitors Vvcc relative to Vref and turns on or off transistors of digital clamp 101 via digital control signals. The feedback loop comprises the signal loop from digital clamp 101 to control unit 103 and back to digital clamp 101 which regulates Vvcc. In one embodiment, Vref is externally generated and supplied to the integrated circuit 100a. For example, an off chip reference generator may provide Vref as an input to the integrated circuit 100a for the control unit 103. In one embodiment, Vref is internally generated. For example, an on-die band-gap reference circuit or any other reference circuit may be used to generate Vref locally and supplied to the control unit 103.

Figure 2A:
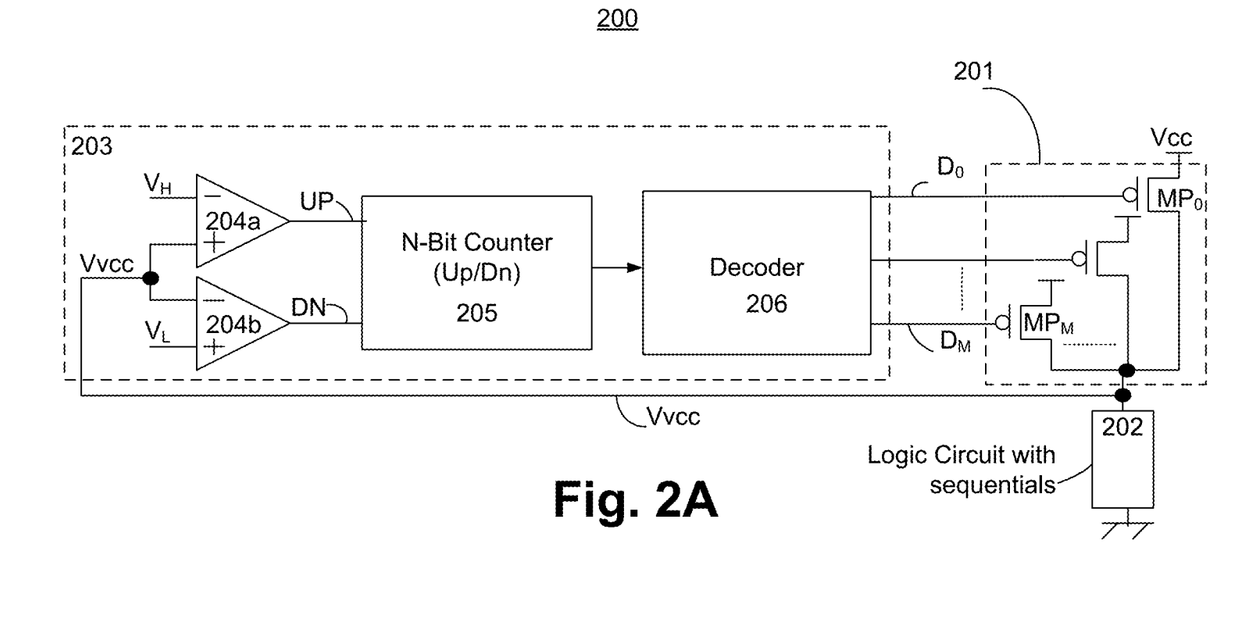
FIG. 2A is an apparatus with a digital clamp with hysteretic control unit to reduce leakage power and retain states of logic units, according to one embodiment of the disclosure.

FIG. 2A is an apparatus 200 with a digital clamp with hysteretic control unit to reduce leakage power and retain states of logic units, according to one embodiment of the disclosure. It is pointed out that those elements of FIG. 2A having the same reference numbers (or names) as the elements of any other figure can operate or function in any manner similar to that described, but are not limited to such.

In one embodiment, apparatus 200 comprises a digital clamp 201 (e.g., digital clamp 101), logic units 202 (e.g., logic units 102), and a hysteretic control unit 203 (e.g., control unit 103).

In one embodiment, digital clamp 201 comprises 'M' number of p-type transistors labeled as $MP_0$ to $MP_M$ to adjust the virtual power supply (Vvcc) (also called the second power supply). In one embodiment, gate terminals of $MP_0$ to $MP_M$ are controlled by digital outputs of hysteretic control 203. In one embodiment, source terminals of $MP_0$ to $MP_M$ are coupled to Vcc (also called the first power supply) and the drain terminals are coupled to Vvcc to provide power to logic units 202. In one embodiment, $MP_0$ to $MP_M$ are binary weighted. In one embodiment, $MP_0$ to $MP_M$ are thermometer weighted. In other embodiments, other weighting techniques may be used.

In one embodiment, hysteretic control 203 comprises a first comparator 204a, second comparator 204b, an N-bit counter 205 (where 'N' is an integer greater than one), and a decoder 206. In one embodiment, first comparator 204a receives a first reference $V_H$ at its negative input terminal and Vvcc at its positive input terminal. In one embodiment, output of first comparator 204a is an UP signal which when asserted causes N-bit counter 205 to count up. In one embodiment, second comparator 204b receives a second reference $V_L$ at its positive input terminal and Vvcc at its negative input terminal. In one embodiment, output of second comparator 204b is a DN (down) signal which when asserted causes N-bit counter 205 to count down. In one embodiment, $V_H$ is greater than $V_L$.

In one embodiment, the reference voltages $V_H$ and $V_L$ are externally generated and supplied to the control unit 203. For example, an off chip reference generator may provide the reference voltages $V_H$ and $V_L$ as inputs to the control unit 203 for the first and second comparators 204a and 204b. In one embodiment, the reference voltages $V_H$ and $V_L$ are internally generated. For example, an on-die band-gap reference circuit or any other reference circuit may be used to generate the reference voltages $V_H$ and $V_L$ locally and supplied to the first and second comparators 204a and 204b.

In one embodiment, N-bit counter 205 is an N-bit UP/DN counter which is operable to count up or down in response to the UP or DN signals from the first and second comparators 204a and 204b respectively, where 'N' is an integer (e.g., 8). In one embodiment, output of N-bit counter 205 is received by decoder 206. In one embodiment, decoder 206 converts output of N-bit counter 205 into binary weighted digital signals $D_0$-$D_M$ to turn on/off transistors $MP_0$-$MP_M$. In one embodiment, decoder 206 converts output of N-bit counter 205 into thermometer weighted digital signals $D_0$-$D_M$ to turn on/off transistors $MP_0$-$MP_M$.

In one embodiment, Vvcc is sampled and compared in parallel with two references ($V_H$ and $V_L$). In one embodiment, when Vvcc>$V_H$, N-bit counter 205 counts up. In one embodiment, when Vvcc<$V_L$, N-bit counter 205 counts down. In one embodiment, output of the N-bit counter 205 drives decoder 206. In one embodiment, decoder 206 is an N-bit-to-$2^N$ bit decoder, whose output is thermometer coded or binary weighted. In one embodiment, outputs of decoder 206 are $D_0$ to $D_M$ ($M=2^N-1$), which drive pull-up p-type devices $MP_0$-$MP_M$. In one embodiment, by closing the loop, once Vvcc settles between $V_H$ and $V_L$, no further action is required and Vvcc settles down to a steady voltage. In one embodiment, the state-retention voltage of logic block 202 is greater than or equal to $V_L$ and that $V_H$=$V_L$ plus necessary guard bands. In one embodiment, a higher count of N-bit counter 205 indicates that a higher number of $D_0$-$D_M$ are "high" and hence more p-type legs of $MP_0$-$MP_M$ are turned OFF.

Figure 2B:
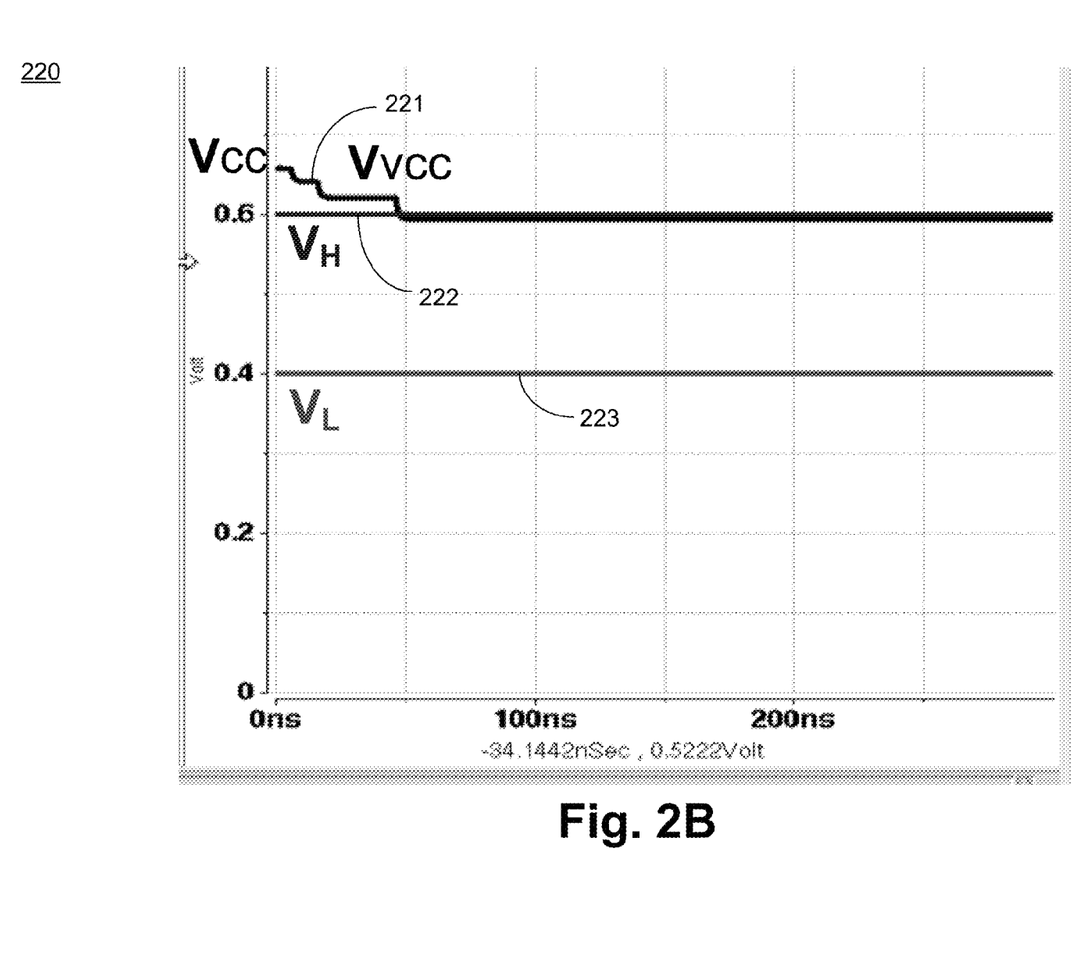
FIG. 2B is a plot showing waveforms of the apparatus which comprises digital clamp with hysteretic control to reduce leakage power and retain states of logic units, according to one embodiment of the disclosure.

FIG. 2B is a plot 220 showing waveforms of apparatus 200 which comprises digital clamp 201 with hysteretic control 203 to reduce leakage power and retain states of logic units, according to one embodiment of the disclosure. It is pointed out that those elements of FIG. 2B having the same reference numbers (or names) as the elements of any other figure can operate or function in any manner similar to that described, but are not limited to such.

The x-axis is time in nonoseconds (ns) while the y-axis is voltage in Volts. The plot 220 shows that during sleep mode (or low power mode) Vvcc 221 drops from Vcc level to a level above $V_L$ 223 but below $V_H$ 222.

Figure 3A:
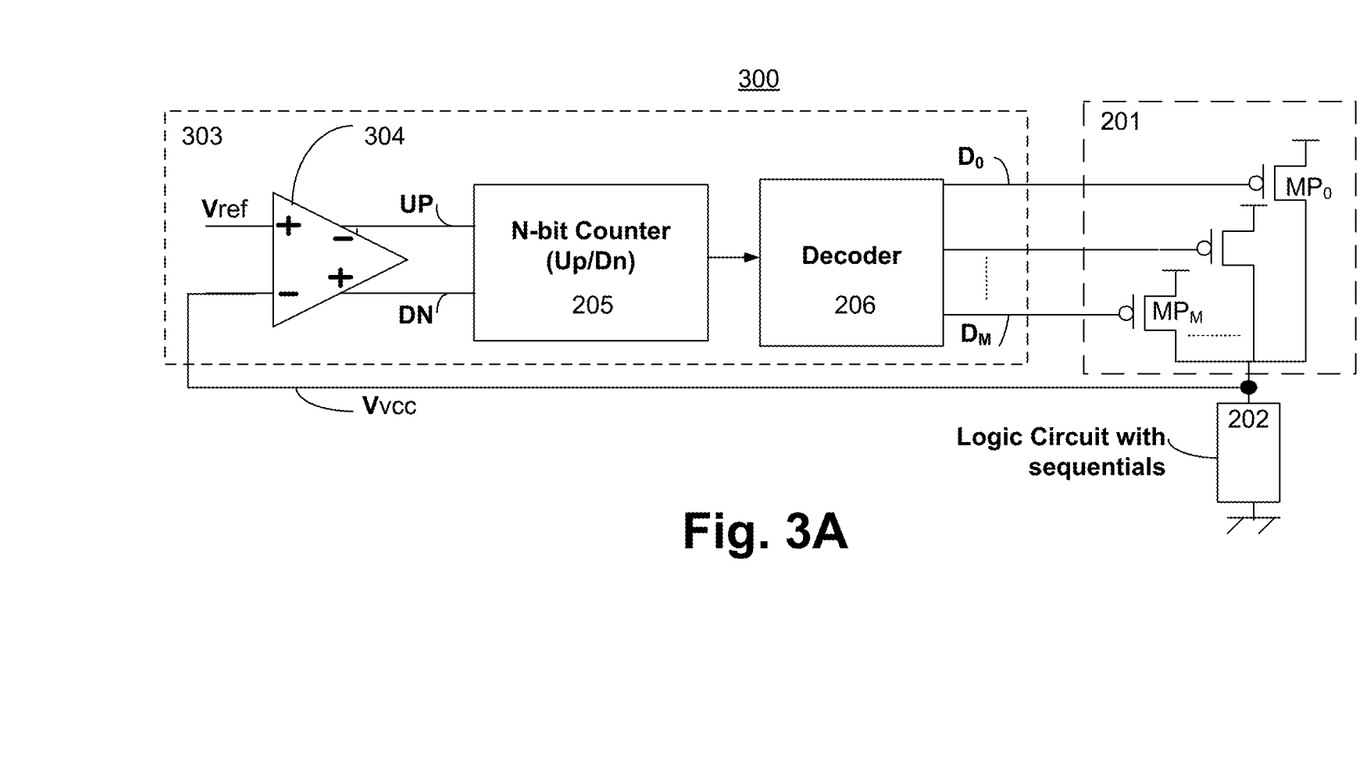
FIG. 3A is an apparatus of a digital clamp with bang-bang control unit to reduce leakage power and retain states of logic units, according to one embodiment of the disclosure.

FIG. 3A is an apparatus 300 of a digital clamp with bang-bang control unit to reduce leakage power and retain states of logic units, according to one embodiment of the disclosure. It is pointed out that those elements of FIG. 3A having the same reference numbers (or names) as the elements of any other figure can operate or function in any manner similar to that described, but are not limited to such.

The embodiment of FIG. 3A is similar to the embodiment of FIG. 2A in that it has the same N-bit counter 205, decoder 206, digital clamp 201, and logic circuit with sequentials 202. One difference between the embodiment of FIG. 3A and that of FIG. 2A is in the control logic. In one embodiment, apparatus 300 comprises a control logic 303 (also called bang-bang control unit) which includes a comparator 304 that receives a reference voltage (Vref). In one embodiment, Vref is received at the positive terminal of comparator 304 while Vvcc is received at the negative terminal of comparator 304. In one embodiment, outputs of comparator 304 are UP and DN signals that instruct N-bit counter 205 to count up or down. In one embodiment, a single comparator 304 is used.

In one embodiment, Vref is externally generated and supplied to the control unit 303. For example, an off chip reference generator may provide the Vref as input to the control unit 303 for the comparator 304. In one embodiment, Vref is internally generated. For example, an on-die bandgap reference circuit or any other reference circuit may be used to generate the Vref locally and supplied to comparator 304.

In one embodiment, Vref is the sum of the state-retention voltage (same as retention voltage supply level) and necessary guard bands. In this embodiment, once Vvcc falls below Vref, DN signal is asserted and N-bit counter 205 counts down. In one embodiment, once Vvcc goes above Vref, UP signal is asserted and N-bit counter 205 counts up. In one embodiment, in steady state, Vvcc oscillates with a small amplitude (depending on the strength of the pull up transistors $MP_0$-$MP_M$), across Vref level, as in a bang-bang comparator.

Figure 3B:
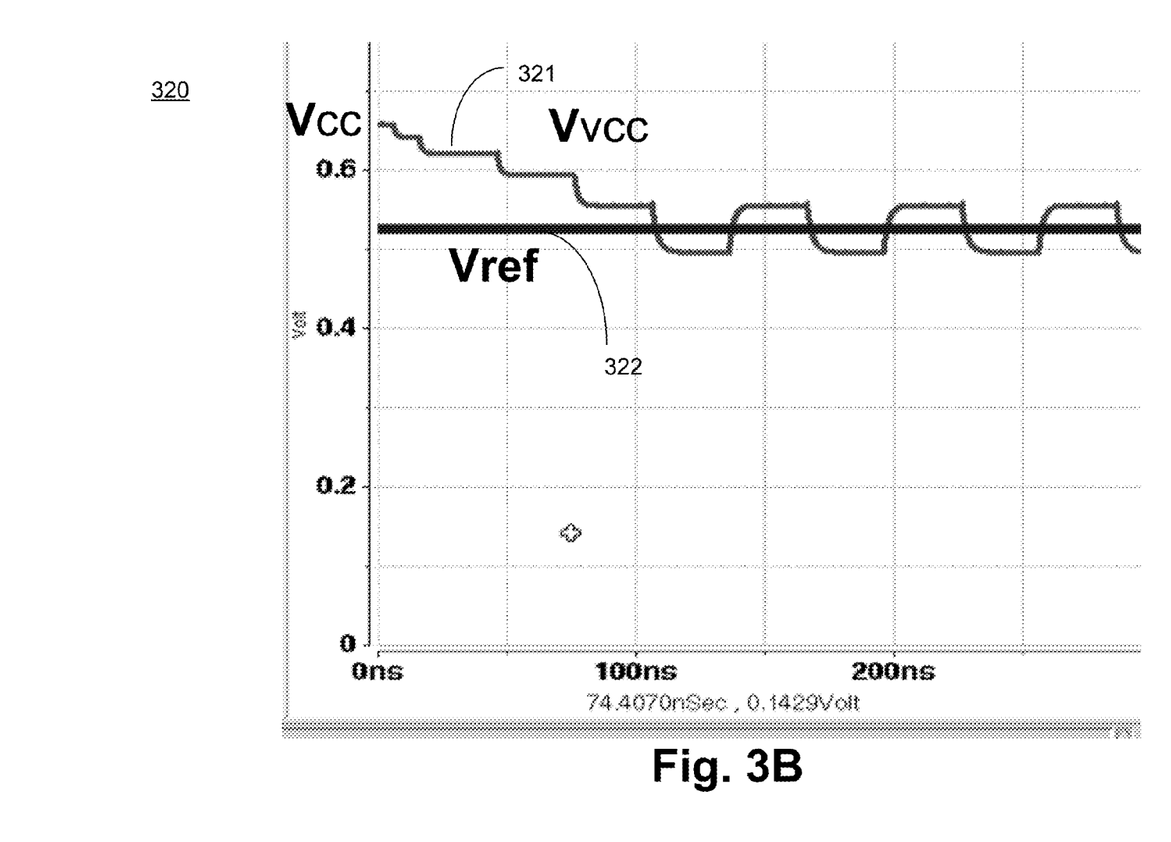
FIG. 3B is a plot showing waveforms of the apparatus which comprises digital clamp with bang-bang control to reduce leakage power and retain states of logic units, according to one embodiment of the disclosure.

FIG. 3B is a plot 320 showing waveforms of the apparatus 300 which comprises digital clamp 201 with bang-bang control 303 to reduce leakage power and retain states of logic units, according to one embodiment of the disclosure. It is pointed out that those elements of FIG. 3B having the same reference numbers (or names) as the elements of any other figure can operate or function in any manner similar to that described, but are not limited to such.

The x-axis is time in nanoseconds while the y-axis is voltage in Volts. The plot 320 shows that during sleep mode (or low power mode) Vvcc 321 drops in a staircase fashion from Vcc level to a level close to Vref 322. When Vvcc 321 reaches a level close to Vref 322, it then oscillates with small amplitude (depending on the strength of the pull up transistors $MP_0$-$MP_M$), across Vref level 322.

Figure 4:
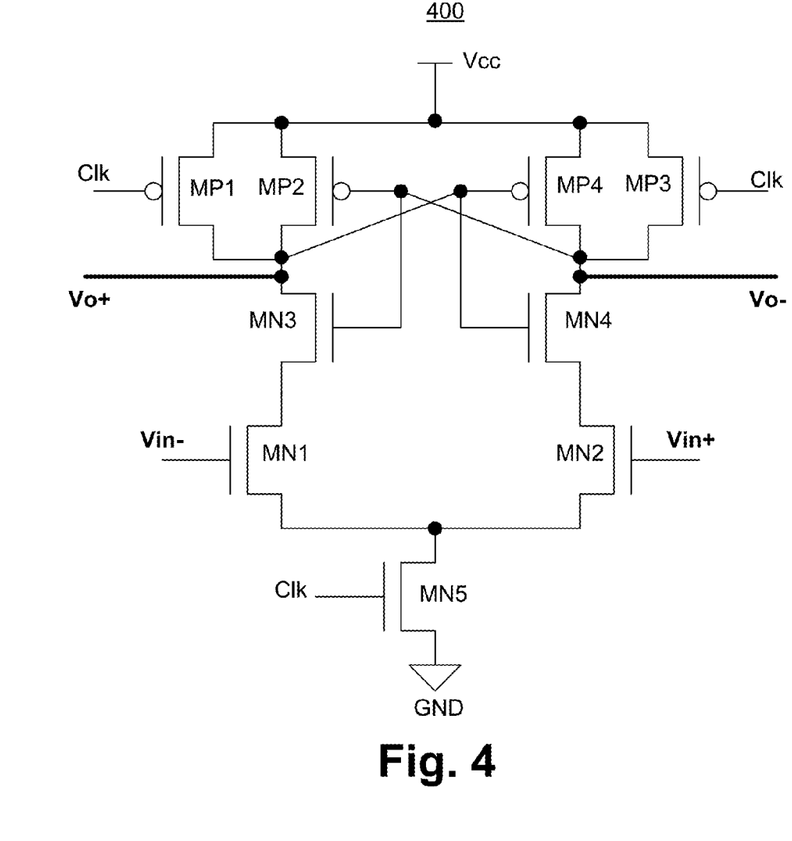
FIG. 4 is a clocked comparator for use in the control logic for controlling the digital clamp, according to one embodiment of the disclosure.

FIG. 4 is a clocked comparator 400 for use in the control logic (e.g., 103, 203, 303) for controlling the digital clamp (e.g., 101, 201), according to one embodiment of the disclosure. It is pointed out that those elements of FIG. 4 having the same reference numbers (or names) as the elements of any other figure can operate or function in any manner similar to that described, but are not limited to such.

In one embodiment, clocked comparator 400 is used for comparators 204a and 204b of FIG. 2A. In one embodiment, clocked comparator 400 is used for comparator 304 of FIG. 3A. The clocked comparator 400 is also referred to as sense amplifier latch 400.

In one embodiment, sense amplifier latch 400 comprises n-type input transistors MN1 and MN2 to receive the input signals on nodes Vin− (e.g., $V_H$ for comparator 204a, Vvcc for comparator 204b, and Vvcc for comparator 304) and Vin+ (e.g., $V_L$ for comparator 204a, Vvcc for comparator 204a, and Vref for comparator 304).

In one embodiment, cross-coupled inverting stages formed from transistors MP2 and MN3 (inverter 1), and transistors MP4 and MN4 (inverter 2) are coupled to input n-type transistors MN1 and MN2 at their respective drain terminals. In one embodiment, p-type transistors MP1 and MP3 are coupled in parallel to MP2 and MP4 to enable or disable transistors MP4 and MP2 respectively on different phases of the clock signal Clk. In one embodiment, outputs Vo+ (e.g., DN of comparator 304) and Vo− (UP of comparator 304) are coupled to the drains of transistors MN3 and MN4 respectively. For comparators 204a and 204b, one of the outputs Vo+ or Vo− may be used as UP and DN signals.

In one embodiment, sense amplifier latch 400 comprises a switchable current source in transistor MN5 which provides current to sense amplifier latch 400. In one embodiment, sense amplifier latch 400 consumes far less power than any traditional amplifier or comparator because the current source MN5 is OFF during the low phase of the clock signal Clk. In such an embodiment, outputs Vo+ and Vo− are held logically high by transistors MP1 and MP3 which are ON during the low phase of the clock signal Clk. In one embodiment, sense amplifier latch 400 samples the input signals Vin− and Vin+ during the high phase of the clock signal Clk. In such an embodiment, transistor MN5 is ON and acts like a current source while transistors MP1 and MP3 are OFF.

In one embodiment, sense (or sensing) amplifier latch 400 has two operating phases-one operating phase is reset, and the other operating phase is evaluation. In one embodiment, during the reset operation phase, output differential nodes Vo+ and Vo− are shorted to Vcc (or Vss in a complimentary structure). In one embodiment, the back-to-back coupled inverters (MN3/MP2 and MN4/MP4) are forced to have equal input/output voltages. In one embodiment, during the evaluation operating phase, the different pair charges the two output nodes Vo+ and Vo− at different rates because the current flowing through the differential pair is a function of the input signals Vin− and Vin+. In such an embodiment, back-to-back coupled inverters (MN3/MP2 and MN4/MP4) see a voltage difference at their inputs/outputs and operate in a positive feedback. The positive feedback causes the voltage difference to be magnified i.e., the inputs/outputs of back-to-back coupled inverters (MN3/MP2 and MN4/MP4) grow quickly to a solid logical '1' or logical '0' levels. Hence, a small voltage at the sensing amplifier inputs (Vin− and Vin+) are magnified to a logic signal. In one embodiment, an RS (reset-set) flip-flop follows sense amplifier latch 400 stage to form a fully functional unit.

In one embodiment, when MN5 is turned ON there is a current that passes through both sides of the sense amplifier latch 400. If the input voltage to the gate of MN1 is higher than the input voltage to the gate of MN2 then the current through the left side of the sense amplifier latch 400 is higher than the right side. A higher current on the left side means that the voltage drop across MP2 is larger than the voltage drop across MP4, which means that the voltage at Vo+ is higher than Vo−. In this embodiment, the top portion of sense amplifier latch 400 comprises two cross-coupled inverters, where the input of each gate is coupled to the output of the other gate. These two inverters may create a positive feedback that quickly forces Vo+ to become Vcc and Vo− to become GND (ground). Through a similar analysis it can be seen that if the input voltage to the gate of MN2 is higher than the input voltage to the gate of MN1, then Vo+ is set to GND and Vo− is set to Vcc.

In one embodiment, transistors MN1 and MN2 are of the same size, transistors MN3 and MN4 are of the same size (W/L), transistors MP2 and MP4 are of the same size, transistors MP1 and MP3 are of the same size. In one embodiment, clocked comparator 400 is a low power comparator with high gain to resolve conditions when Vvcc is close to $V_H$/$V_L$ or Vref. As discussed above, clocked comparator 400 with a cross-coupled inverter load provides high gain, has no biasing current and consumes low power. In one embodiment, clocked comparator 400 requires no startup time or startup circuits (as is the case with op-amp comparators).

Figure 5:
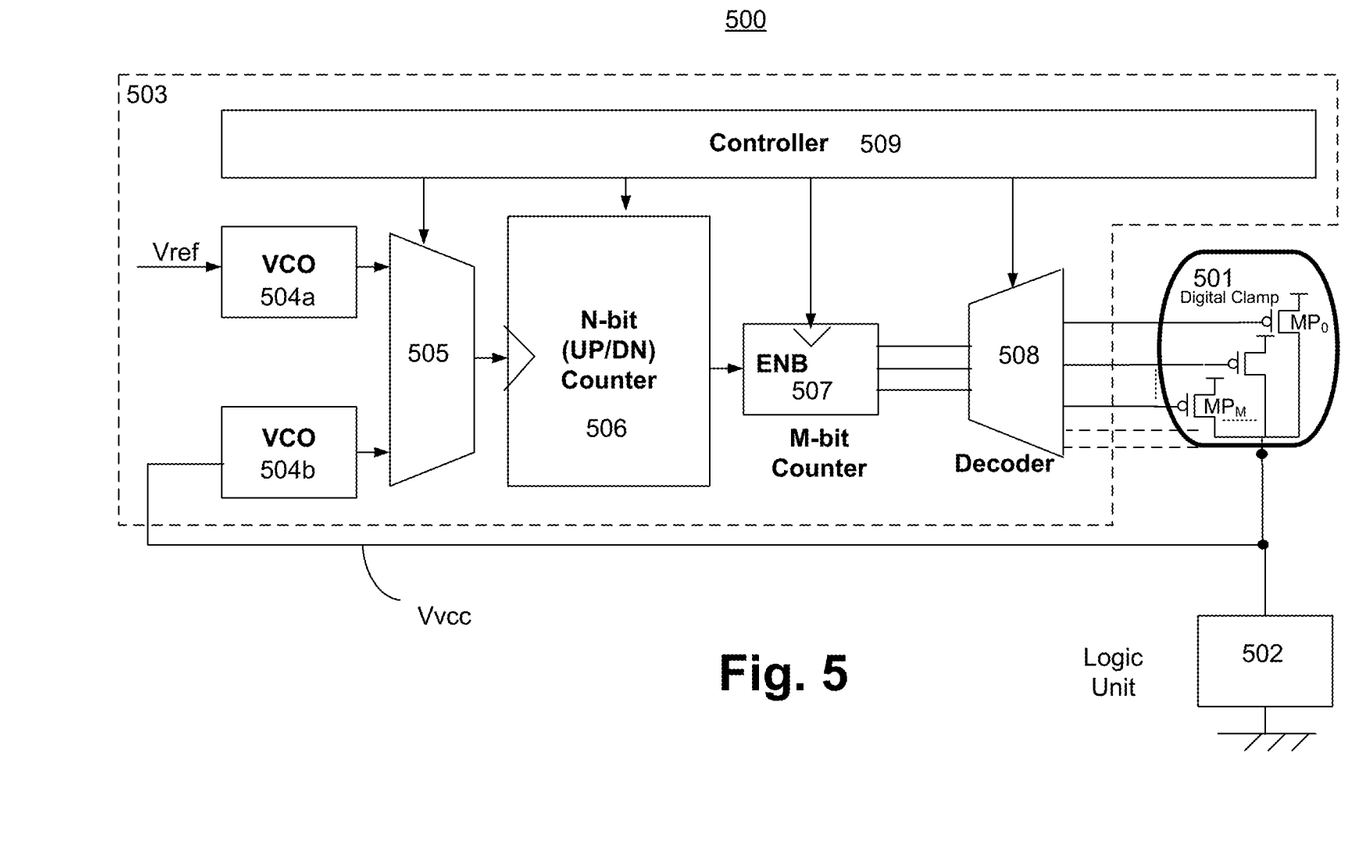
FIG. 5 is an apparatus comprising a digital clamp controllable via oscillators, according to one embodiment of the disclosure.

FIG. 5 is an apparatus 500 comprising a digital clamp controllable via oscillators, according to one embodiment of the disclosure. It is pointed out that those elements of FIG. 5 having the same reference numbers (or names) as the elements of any other figure can operate or function in any manner similar to that described, but are not limited to such.

In one embodiment, apparatus 500 comprises a digital clamp 501 (same as clamps 101 and 201), logic units 502 (same as logic units 102, 202), and a control unit 503. In one embodiment, control unit 503 comprises a first oscillator 504a, a second oscillator 504b, a multiplexer 505, a first counter 506 (N-bit counter), a second counter 507 (M-bit counter), and a decoder 508, where 'N' and 'M' are integers, and where 'N' is greater or equal to 'M.'

In one embodiment, first oscillator 504a is a voltage controlled oscillator (VCO) that has a controllable oscillation frequency which is controllable by Vref. In one embodiment, Vref is externally generated and supplied to the control unit 503. For example, an off chip reference generator may provide the Vref as input to the control unit 503 for the first oscillator 504a. In one embodiment, Vref is internally generated. For example, an on-die band-gap reference circuit or any other reference circuit may be used to generate the Vref locally and supplied to first oscillator 504a.

In one embodiment, output of first oscillator 504a is a periodic signal with a frequency dependent on Vref. In one embodiment, output of first oscillator 504a is received by multiplexer 505. In one embodiment, second oscillator 504b is a VCO that has a controllable oscillation frequency which is controllable by Vvcc. In one embodiment, output of second oscillator 504b is a periodic signal with a frequency dependent on Vvcc. In one embodiment, output of second oscillator 504b is received by multiplexer 505.

In one embodiment, the floor plan and design of first and second oscillators 504a and 504b are identical or substantially the same. One reason for using VCOs 504a and 504b is to avoid small swing sensing of Vref, $V_L$, $V_H$, and Vvcc as described in embodiments of FIG. 2A and FIG. 3A. In one embodiment, VCOs 504a and 504b are implemented as a chain of current starved inverters (in a loop) with current strength controllable by Vref or Vvcc. In other embodiments, other architectures of VCO may be used for VCOs 504a and 504b.

In one embodiment, multiplexer 505 is controllable by a select signal generated by controller 509. In one embodiment, controller 509 is a finite state machine (FSM). In one embodiment, controller 509 generates control signals for other logic units e.g., N-bit counter 506, M-bit counter 507, and decoder 508. In one embodiment, controller 509 causes multiplexer 505 to select output of VCO 504a as clock signal to the N-bit counter 506 to cause the N-bit counter 506 to count up with a frequency associated with Vref. In one embodiment, controller 509 causes multiplexer 505 to select output of VCO 504b as clock signal to the N-bit counter 506 to cause the N-bit counter 506 to count down with a frequency associated with Vvcc.

In one embodiment, output of N-bit counter 506 is the residue signal received as an enable signal (ENB) to enable counting by M-bit counter 507 (where 'M' is an integer, and where 'M' is same or different than 'N'). In one embodiment, if residue is greater than zero, controller 509 causes the M-bit counter to count up. In one embodiment, if residue is less than zero or equal to zero, controller 509 causes the M-bit counter 507 to count down. In one embodiment, controller 509 causes decoder 508 to decode output of the M-bit counter 507 to generate control signals for controlling clamp transistors of digital clamp 501.

In the embodiment of FIG. 5, instead of using the clocked small signal comparator as used in the embodiments of FIG. 2 and FIG. 3, two VCOs 504a and 504b are used. In this embodiment, Vref and Vvcc control two current starved VCOs 504a and 504b, which produce two signals of different frequencies. In one embodiment, the two signals of different frequencies are integrated and the residue of the integration is determined by the digital N-bit UP/DN counter 506. In one embodiment, if the two signals (outputs of VCOs 504a and 504b received by multiplexer 505) have the same frequency, the N-bit counter 506 is instructed to count up and down by the same amount, and so the residue does not change.

In one embodiment, if the residue is greater than zero, the output of the N-bit counter 506 indicates that Vref>Vvcc (Vref is greater than Vvcc). In one embodiment, if the residue is less than zero, Vref<Vvcc (Vref is less than Vvcc).

In one embodiment, depending on the residue, M-bit UP/DN counter 507 is either caused to count up or to count down. In one embodiment, output of M-bit counter 507 is decoded into control signals to turn on/off clamp transistors $MP_0$-$MP_M$. The same concept can be applied to a build a hysteretic controller 203, where an extra VCO is used to sample the $V_L$.

Figure 6A:
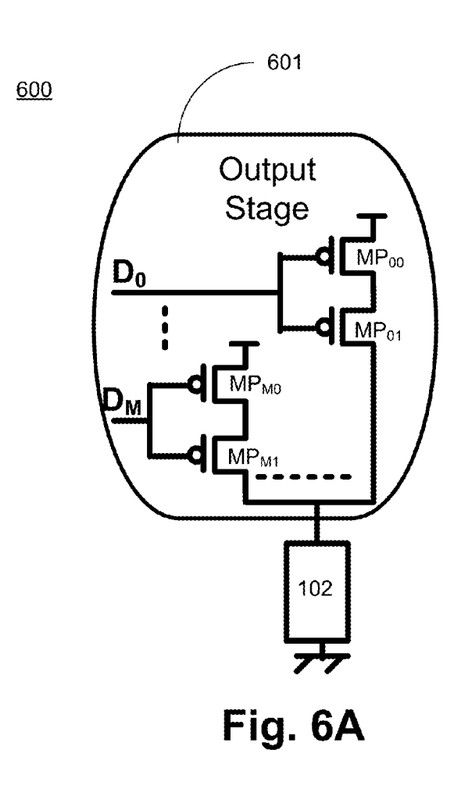
FIG. 6A is an apparatus with a digital clamp with stacked drivers comprising two stacked devices, according to one embodiment of the disclosure.

FIG. 6A is an apparatus 600 with a digital clamp 601 with stacked drivers comprising two devices, according to one embodiment of the disclosure. It is pointed out that those elements of FIG. 6A having the same reference numbers (or names) as the elements of any other figure can operate or function in any manner similar to that described, but are not limited to such.

It should be noted that if the size of the logic units 102, that is clamped, is small then the total leakage current that to be supported by the "ON" p-type devices of the digital clamp 101/201/501 is small. It may so happen that even the min-width p-type pull-up devices is too large for the amount of current that it needs to support while clamping the Vvcc to a voltage around retention voltage supply level (e.g., 0.5 or 0.6V). In one embodiment, digital clamp 601 employs stacked p-type devices to reduce current strength and still provide enough resolution for a fine grained clamping voltage on the Vvcc. In this embodiment, each p-type device of digital clamp 201/501 is stacked with another p-type device (e.g., $MP_{00}$ and $MP_{01}$, and $MP_{M0}$ and $MP_{M1}$).

Figure 6B:
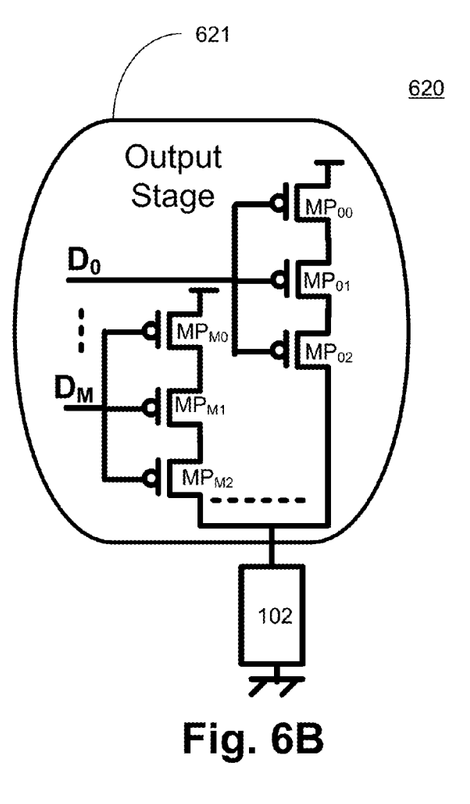
FIG. 6B is an apparatus with a digital clamp with stacked drivers comprising three stacked devices, according to one embodiment of the disclosure.

FIG. 6B is an apparatus 620 with a digital clamp 621 with stacked (or cascoded) drivers comprising three devices, according to one embodiment of the disclosure. It is pointed out that those elements of FIG. 6B having the same reference numbers (or names) as the elements of any other figure can operate or function in any manner similar to that described, but are not limited to such. The embodiment of FIG. 6B is similar to the embodiment of FIG. 6A except that each p-type device of digital clamp 101/201/501 is stacked with two more p-type devices (e.g., $MP_{00}$, $MP_{00}$, and $MP_{02}$, and $MP_{M0}$, $MP_{M1}$, and $MP_{M2}$). In other embodiments, more stacked devices may be stacked to each p-type device of the digital clamp 101/201/501/621.

Figure 7A:
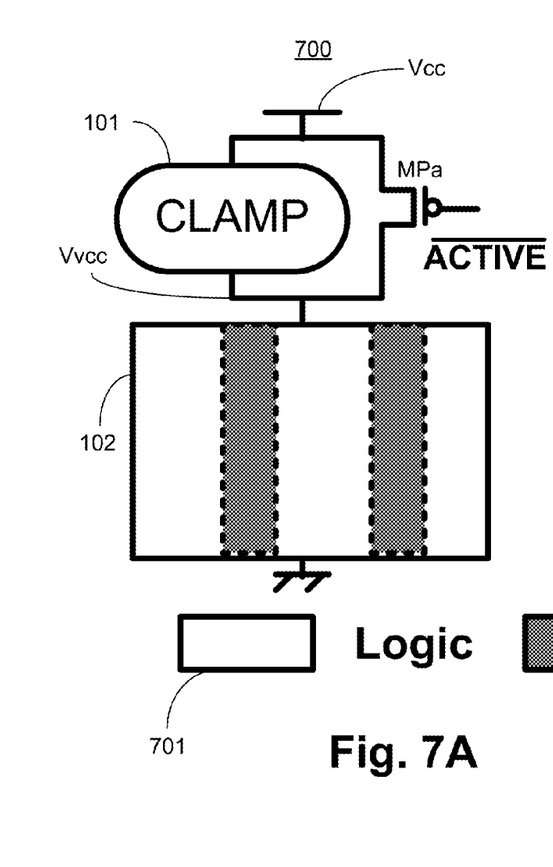
FIG. 7A illustrates architecture showing the use of digital clamps for the entire logic units of a processor, according to one embodiment of the disclosure.

FIG. 7A illustrates architecture 700 showing the use of digital clamps for the entire logic units of a processor, according to one embodiment of the disclosure. It is pointed out that those elements of FIG. 7A having the same reference numbers (or names) as the elements of any other figure can operate or function in any manner similar to that described, but are not limited to such. In one embodiment, architecture 700 comprises a digital clamp 101, an active device MPa, and logic units 102.

In one embodiment, one or more active device(s) MPa are coupled in parallel to the digital clamp 101 such that Vvcc is provided as supply to the entire logic unit 102. In such an embodiment, source terminal of the one or more active device(s) MPa is coupled to Vcc and the drain terminal of the one or more active device(s) MPa is coupled to Vvcc. In the exemplary embodiment, the shaded regions (702) of the logic unit 102 are the sequential units 702 (e.g., flip-flop, memory cells, latches, etc.) while the un-shaded portions (701) of logic unit 102 are non-sequential units (e.g., combinational logic unit). In one embodiment, during normal power mode, MPa is ON. In one embodiment, during normal power mode, all clamp transistors of digital clamp 101 are also ON. In one embodiment, during low power mode (e.g., sleep mode), MPa is OFF while certain number of transistors of digital clamp 101 are ON to clamp Vcc to a Vvcc level corresponding to a retention voltage supply level.

Figure 7B:
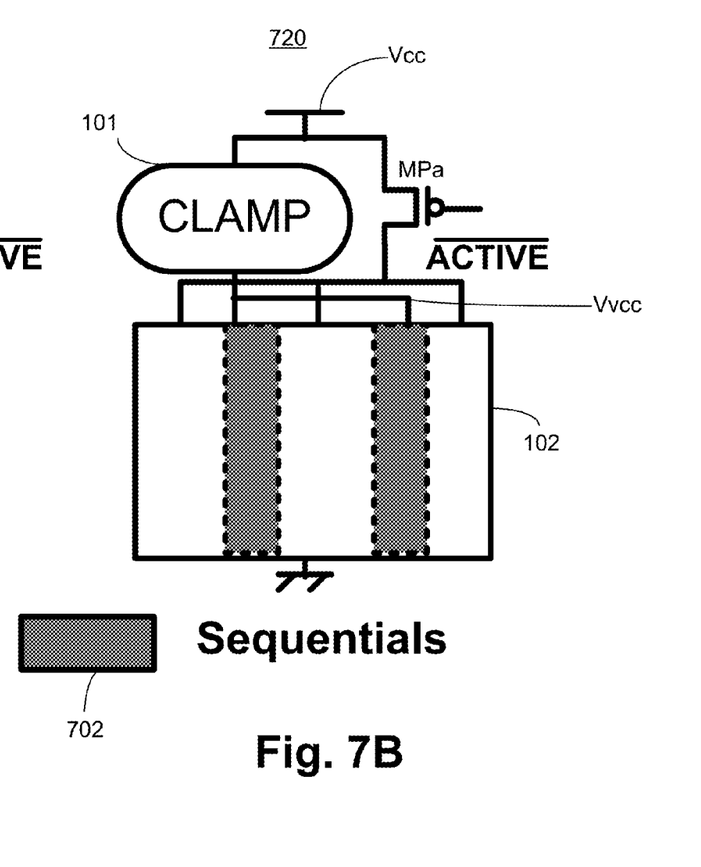
FIG. 7B illustrates architecture showing the use of digital clamps for the sequential units of a processor, according to one embodiment of the disclosure.

FIG. 7B illustrates architecture 720 showing the use of digital clamps for the sequential units of a processor, according to one embodiment of the disclosure. It is pointed out that those elements of FIG. 7B having the same reference numbers (or names) as the elements of any other figure can operate or function in any manner similar to that described, but are not limited to such. In one embodiment, architecture 720 comprises digital clamp 101, active device MPa, and logic units 102.

Embodiment of FIG. 7B is similar to the embodiment of FIG. 7A except that clamping is performed for sequential logic units only. If Vvcc to the sequentials can be separately routed, then only the sequential unit 702 (or only the sequentials needed for state retention) can be clamped by the digital clamp 101, according to one embodiment. If the sequential unit 702 can be clamped and not the logic units 102 as a whole, then only the slave stages of the sequential can be clamped for even higher power savings, according to one embodiment.

Figure 8:
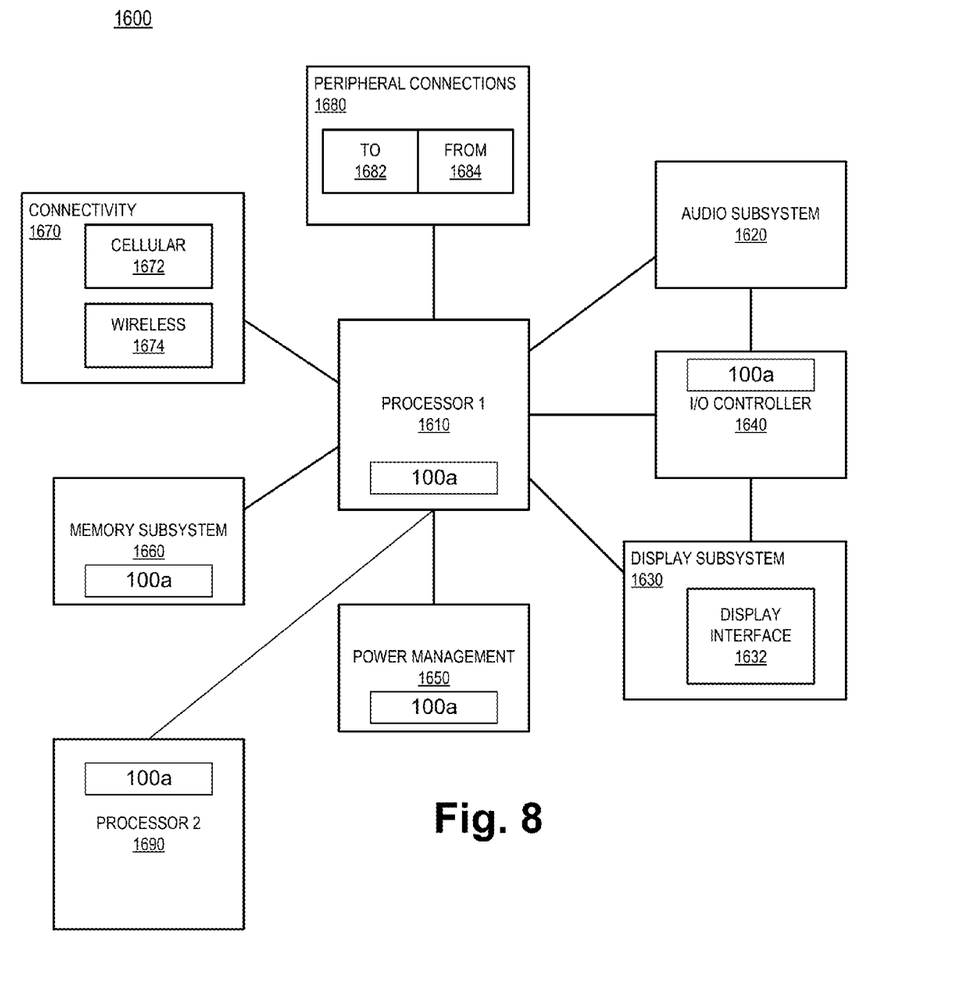
FIG. 8 is a smart device or a computer system or a SOC (System-on-Chip) with the apparatus to reduce leakage power and retain states of logic units, according to one embodiment of the disclosure.

FIG. 8 is a smart device 1600 or a computer system or SOC (System-on-Chip) with the apparatus to reduce leakage power and retain states of logic units, according to one embodiment of the disclosure. It is pointed out that those elements of FIG. 8 having the same reference numbers (or names) as the elements of any other figure can operate or function in any manner similar to that described, but are not limited to such. FIG. 8 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, computing device 1600 includes a first processor 1610 with the apparatus of integrated circuit 100a, and a second processor 1690 with the apparatus of integrated circuit 100a, according to the embodiments. Other blocks of the computing device with I/O drivers may also include the apparatus of integrated circuit 100a. The various embodiments of the present disclosure may also comprise a network interface within connectivity 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment an apparatus comprises: a clamp coupled between a first power supply and a second power supply; and a circuit to operate with the second power supply, wherein the clamp is operable to adjust the second power supply when the apparatus enters a low power mode. In one embodiment, the apparatus further comprises: a comparator to compare the second power supply with a reference; a counter to count up or down according to an output of the comparator; and a decoder to convert an output of the counter to a digital control signal for adjusting the second power supply via the clamp.

In one embodiment, the comparator is a clocked comparator. In one embodiment, the clamp comprises p-type devices coupled to the first and second power supplies, wherein the digital control signal of the decoder is provided to the clamp for controlling the clamp. In one embodiment, the decoder to generate a thermometer coded digital control signal or a binary weighted digital control signal. In one embodiment, the circuit comprises combinational logic units and sequential units.

In one embodiment, the apparatus further comprises: a first oscillator to generate a signal of first frequency; a second oscillator to generate a signal of second frequency; and a multiplexer to selectively select one of the signals of first and second frequencies. In one embodiment, the first oscillator to receive a reference voltage, and wherein the second oscillator is coupled to the second power supply. In one embodiment, the apparatus further comprises a first counter to count up or down in response to an output of the multiplexer. In one embodiment, the apparatus further comprises a second counter to count up or down according to an output of the first counter. In one embodiment, the apparatus further comprises a decoder to generate a digital signal according to an output of the second counter, the digital signal to adjust the second power supply via the clamp. In one embodiment, the low power mode is a sleep mode.

In another example, a processor comprises: a clamp coupled between a first power supply and a second power supply; a power gate, in parallel to the clamp, and coupled between the first and second power supplies; and a circuit to operate with the second power supply, wherein the clamp is operable to adjust the second power supply to a voltage level above a retention level when the processor enters a low power mode, and wherein the power gate is operable to provide the circuit with the second power supply substantially equal to the first power supply during normal operation.

In one embodiment, the clamp and the power gate comprise p-type devices coupled between the first and second power supplies. In one embodiment, the circuit comprises at least one of: combinational logic units and sequential units. In one embodiment, the low power mode is a sleep mode. In one embodiment, the retention level is below a level of the first power supply.

In one embodiment, the processor further comprises: a comparator to compare the second power supply with a reference; a counter to count up or down according to an output of the comparator, and a decoder to convert an output of the counter to a digital control signal for adjusting the second power supply via the clamp.

In another example, a system comprises: a memory; a processor, coupled to the memory, the processor including: a clamp coupled between a first power supply and a second power supply; and a circuit to operate with the second power supply, wherein the clamp is operable to adjust the second power supply when the apparatus enters a low power mode; and a wireless interface for allowing the processor to communicate with another device.

In one embodiment, the processor further comprises: a comparator to compare the second power supply with a reference; a counter to count up or down according to an output of the comparator, and a decoder to convert an output of the counter to a digital control signal for adjusting the second power supply via the clamp.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a clamp coupled between a first power supply and a second power supply, wherein the clamp includes a plurality of transistors;
   a circuit to operate with the second power supply; and
   a control unit to turn on and off transistors of the plurality of transistors to adjust the second power supply when the apparatus enters a low power mode, comprising:
   a first comparator to compare the second power supply with a first reference;
   a second comparator to compare the second power supply with a second reference; and
   a counter coupled to the first and second comparators, wherein a count of the counter is indicative of a number of transistors of the clamp being turned off.

2. The apparatus of claim 1, wherein a higher count of the counter corresponds to more transistors of the clamp being turned off.

3. The apparatus of claim 2, wherein the counter counts up when the second power supply is higher than the first reference and counts down when the second power supply is lower than the second reference, such that the second power supply settles at a level between the first and second references, and wherein the second reference is lower than the first reference.

4. The apparatus of claim 3, further comprising:
   a decoder to convert an output of the counter to a digital control signal for adjusting the second power supply via the clamp.

5. The apparatus of claim 4, wherein the clamp comprises p-type devices coupled to the first and second power supplies, and wherein the digital control signal of the decoder is provided to the clamp for controlling the clamp.

6. The apparatus of claim 4, wherein the decoder to generate a thermometer coded digital control signal or a binary weighted digital control signal.

7. A processor comprising:
   a clamp coupled between a first power supply and a second power supply, wherein the clamp includes a plurality of transistors;
   a power gate, in parallel to the clamp, and coupled between the first and second power supplies;
   a first comparator to compare the second power supply with a first reference;
   a second comparator to compare the second power supply with a second reference;
   a counter coupled to the first and second comparators, wherein a count of the counter is indicative of a number of transistors of the clamp being turned off; and
   a circuit to operate with the second power supply, wherein the clamp is operable to adjust the second power supply to a voltage level above a retention level when the processor enters a low power mode, and wherein the power gate is operable to provide the circuit with the second power supply substantially equal to the first power supply during normal operation.

8. The processor of claim 7, wherein a higher count of the counter corresponds to more transistors of the clamp being turned off.

9. The processor of claim 8, wherein the counter counts up when the second power supply is higher than the first reference and counts down when the second power supply is lower than the second reference, such that the second power supply settles at a level between the first and second references, and wherein the second reference is lower than the first reference.

10. The processor of claim 9, further comprising:
    a decoder to convert an output of the counter to a digital control signal for adjusting the second power supply via the clamp.

11. The processor of claim 9, wherein the clamp and the power gate comprise p-type devices coupled between the first and second power supplies.

12. The processor of claim 9, wherein the low power mode is a sleep mode and the retention level is below a level of the first power supply.

* * * * *